US012798959B2

(12) United States Patent
Fukumitsu et al.

(10) Patent No.: US 12,798,959 B2
(45) Date of Patent: Nov. 17, 2026

(54) MEMS DEVICE

(71) Applicant: Murata Manufacturing Co., Ltd., Nagaokakyo (JP)

(72) Inventors: Masakazu Fukumitsu, Nagaokakyo (JP); Anssi Blomqvist, Nagaokakyo (JP); Altti Torkkeli, Nagaokakyo (JP); Ville Kaajakari, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 364 days.

(21) Appl. No.: 18/430,924

(22) Filed: Feb. 2, 2024

(65) Prior Publication Data

US 2024/0174511 A1 May 30, 2024

Related U.S. Application Data

(63) Continuation of application No. PCT/JP2022/012194, filed on Mar. 17, 2022.

(30) Foreign Application Priority Data

Aug. 30, 2021 (JP) ................................ 2021-140359

(51) Int. Cl.
*B81B 3/00* (2006.01)
*G01P 15/125* (2006.01)

(52) U.S. Cl.
CPC .... *B81B 3/0086* (2013.01); *B81B 2201/0235* (2013.01); *B81B 2203/0323* (2013.01);
(Continued)

(58) Field of Classification Search
CPC .......... B81B 3/0086; B81B 2203/0323; B81B 2201/0235
See application file for complete search history.

(56) References Cited

U.S. PATENT DOCUMENTS 6,815,739 B2 * 11/2004 Huff ...................... B81B 7/0064
438/455
2006/0156819 A1 7/2006 Robert
(Continued)

FOREIGN PATENT DOCUMENTS

CN 105182005 A 12/2015
JP H06138143 A 5/1994
(Continued)

OTHER PUBLICATIONS

Official Communication issued in corresponding European Patent Application No. 22863894.6, mailed on Jun. 10, 2025, 9 pages.
(Continued)

*Primary Examiner* — Dale E Page
*Assistant Examiner* — Wilner Jean Baptiste
(74) *Attorney, Agent, or Firm* — Keating & Bennett, LLP

(57) ABSTRACT

An inertial sensor includes a MEMS substrate and an upper lid joined to the MEMS substrate. The MEMS substrate includes a capacitance portion including first and second movable electrodes causing a capacitance to change in accordance with a distance between the first and second movable electrodes, a holding portion holding the capacitance portion, and a spring portion connecting the capacitance portion and the holding portion to each other and supporting the first movable electrode and the second movable electrode in a displaceable manner with respect to the holding portion.

20 Claims, 5 Drawing Sheets

(52) U.S. Cl.
CPC ..... *B81B 2203/04* (2013.01); *B81B 2207/095* (2013.01); *G01P 15/125* (2013.01)

(56) References Cited

U.S. PATENT DOCUMENTS

| | | | | |
|---|---|---|---|---|
| 2010/0313660 | A1* | 12/2010 | Nishikage | G01P 15/0802 73/514.32 |
| 2013/0340525 | A1 | 12/2013 | Liu | |
| 2018/0246141 | A1 | 8/2018 | Taketani | |
| 2018/0372774 | A1 | 12/2018 | Isobe et al. | |
| 2019/0094262 | A1* | 3/2019 | Ito | G01P 15/135 |

FOREIGN PATENT DOCUMENTS

| | | | |
|---|---|---|---|
| JP | 2006189433 | A | 7/2006 |
| JP | 2008070284 | A | 3/2008 |
| JP | 2017090069 | A | 5/2017 |
| WO | 2017183082 | A1 | 10/2017 |

OTHER PUBLICATIONS

International Search Report in PCT/JP2022/012194, mailed Jun. 14, 2022, 3 pages.
Written Opinion in PCT/JP2022/012194, mailed Jun. 14, 2022, 3 pages.
Official Communication issued in corresponding Chinese Patent Application No. 202280059137.7, mailed on Sep. 16, 2026, 7 pages.

* cited by examiner

MEMS DEVICE

CROSS REFERENCE TO RELATED APPLICATIONS

This application claims the benefit of priority to Japanese Patent Application No. 2021-140359 filed on Aug. 30, 2021 and is a Continuation application of PCT Application No. PCT/JP2022/012194 filed on Mar. 17, 2022. The entire contents of each application are hereby incorporated herein by reference.

BACKGROUND OF THE INVENTION

1. Field of the Invention

The present invention relates to MEMS devices.

2. Description of the Related Art

Devices manufactured using MEMS (micro electro mechanical systems) technology have come into widespread use. Such a device is formed, for example, by joining an upper substrate to a lower substrate including an element.

For example, International Publication No. 2017/183082 discloses an acceleration sensor that includes a movable portion rotating about a rotation shaft between a base substrate and a cap substrate, a left capacitor including an upper-left electrode of the cap substrate and a left movable electrode of the movable portion, and a right capacitor including an upper-right electrode of the cap substrate and a right movable electrode of the movable portion. When the acceleration sensor is subjected to vertical vibration acceleration, the left movable electrode and the right movable electrode vibrate in a rotational displacement direction. Accordingly, the capacitance of the capacitor between the left movable electrode and the upper-left electrode and the capacitance of the capacitor between the right movable electrode and the upper-right electrode vibrate in opposite phases. In addition, the acceleration sensor detects the acceleration vibration in the vertical direction in accordance with the output based on the capacity difference between these capacitances, thereby detecting the acceleration.

In the acceleration sensor disclosed in International Publication No. 2017/183082, the upper-left electrode and the upper-right electrode are formed on the cap substrate, with the upper-left electrode serving as a fixed electrode for the left movable electrode and the upper-right electrode serving as a fixed electrode for the right movable electrode.

On the other hand, the cap substrate often deforms in response to, for example, a mold pressure being applied during packaging or in response to a pressure caused by differences in thermal expansion being applied during mounting on the substrate.

Since the fixed electrode formed on the cap substrate is easily affected by deformation of the cap substrate, deformation of the cap substrate may change the capacitance between the fixed electrode and the movable electrode and may reduce the detection accuracy of the capacitance.

SUMMARY OF THE INVENTION

Example embodiments of the present invention provide MEMS devices that each reduce or prevent reduction in detection accuracy of capacitance.

A MEMS device according to an example embodiment of the present invention includes a first substrate including a capacitance portion including a first movable electrode and a second movable electrode causing a capacitance to change in accordance with a distance between the first movable electrode and the second movable electrode, a holding portion that holds the capacitance portion, and an elastic portion that connects the capacitance portion and the holding portion to each other, the elastic portion supporting the first movable electrode and the second movable electrode in a displaceable manner with respect to the holding portion and a second substrate joined to the first substrate.

According to example embodiments of the present invention, a reduction in detection accuracy of capacitance is prevented or decreased.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Figure 1:
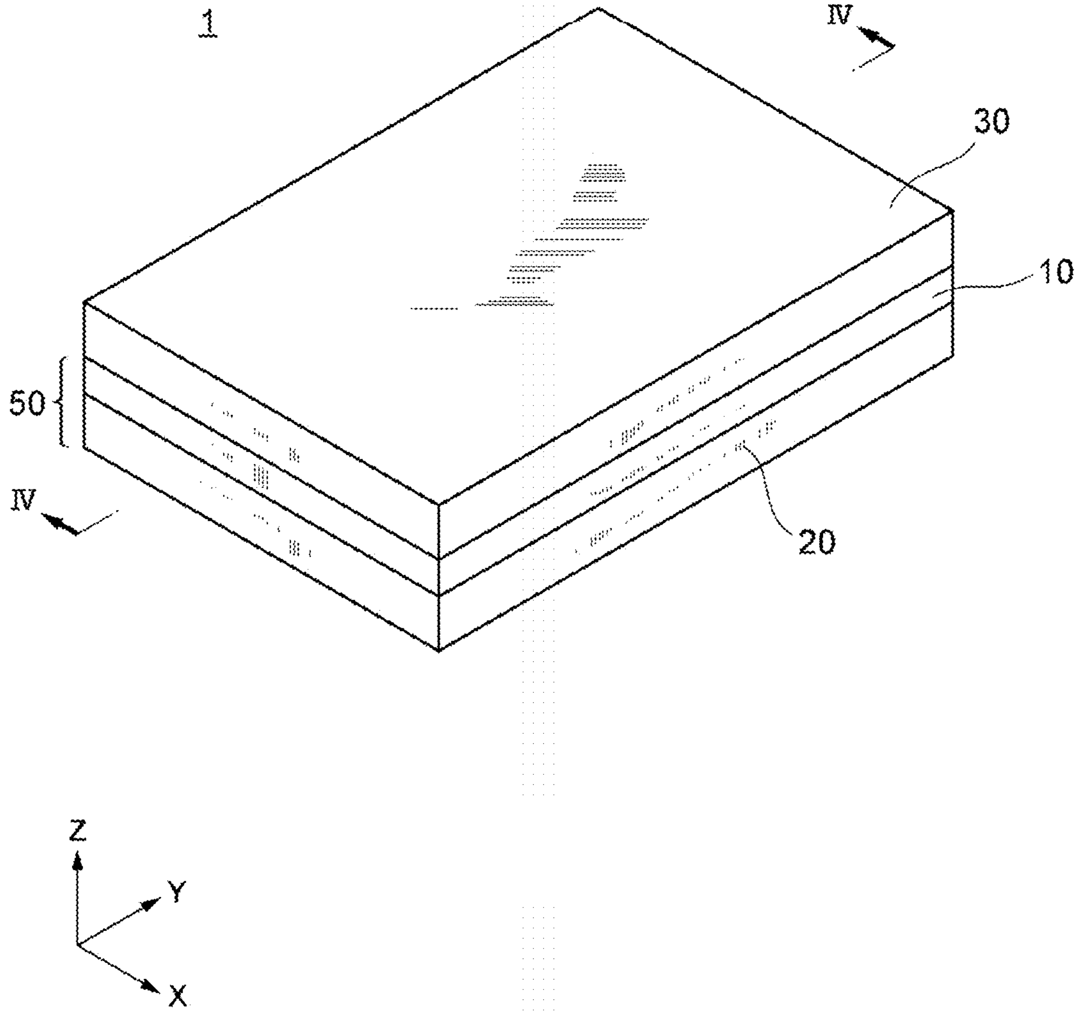
FIG. 1 is a perspective view schematically illustrating an inertial sensor according to an example embodiment of the present invention.

Example embodiments of the present invention will be described below with reference to the drawings. In the drawings, the same or similar components are denoted by the same or similar reference numerals. Since the drawings are examples and the dimensions and shapes of individual components are schematic, the technical scope of the present invention should not be limited to the example embodiments.

Figure 2:
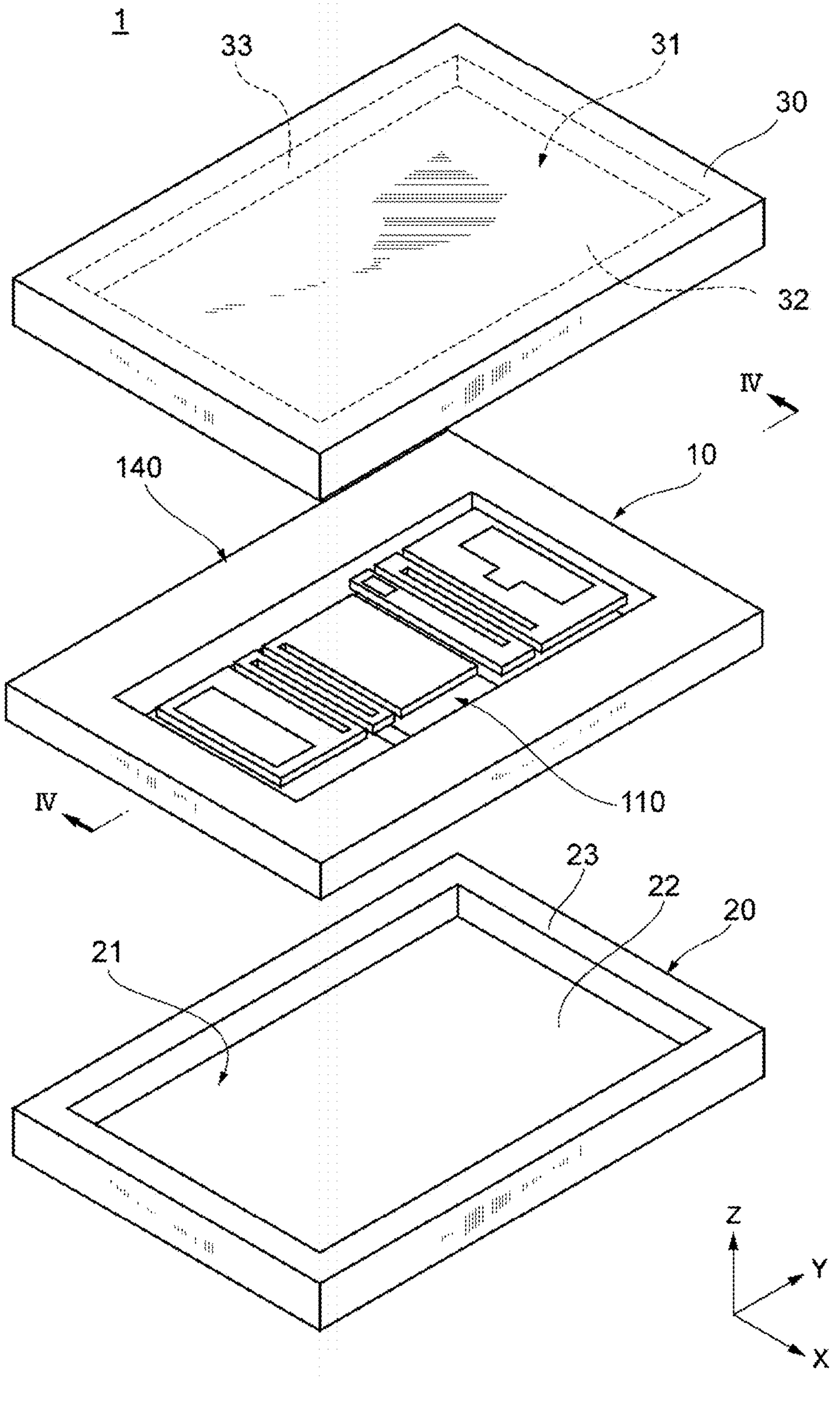
FIG. 2 is an exploded perspective view schematically illustrating the structure of a resonant device illustrated in FIG. 1.

First, the schematic structure of an inertial sensor according to an example embodiment of the present invention will be described with reference to FIGS. 1 and 2. FIG. 1 is a perspective view schematically illustrating an inertial sensor 1 according to the present example embodiment. FIG. 2 is an exploded perspective view schematically illustrating the structure of the inertial sensor 1 illustrated in FIG. 1.

In the following description, the inertial sensor 1 that includes a lower lid 20 and an element 10, which are also collectively referred to below as a MEMS substrate 50, and an upper lid 30 and detects the acceleration or the angular velocity applied in at least one direction will be described as an example of a MEMS device. However, the present example embodiment is not limited to the inertial sensor 1.

The inertial sensor 1 includes the lower lid 20, the element 10, and the upper lid 30. That is, in the inertial sensor 1, the MEMS substrate 50, a joining portion 60, and the upper lid 30 are laminated in this order. The MEMS substrate 50 corresponds to an example of the first substrate, and the upper lid 30 corresponds to an example of the second substrate.

The components of the inertial sensor 1 will be described below. In the following description, the side of the inertial sensor 1 on which the upper lid 30 is provided is the top (or the front), and the side on which the lower lid 20 is provided is the bottom (or the back).

The element 10 is a MEMS element manufactured using MEMS technology and is, for example, an element that detects acceleration in a Z-axis direction. The element 10, the lower lid 20, and the upper lid 30 are joined to each other to define a displaceable space in which the element 10 is sealed, and a capacitance portion 110 of the element 10, which will be described later, is displaceable. In addition, the element 10, the lower lid 20, and the upper lid 30 are made of, for example, silicon (Si) substrates (referred to below as Si substrates), and the Si substrates are joined to each other. The element 10, the lower lid 20, and the upper lid 30 may also be made of, for example, silicon-on-insulator (SOI) substrates in which silicon layers and silicon oxidation films are laminated together. In particular, the element 10 and the lower lid 20 may also be integrally made of cavity SOI (CSOI) substrates, for example.

The lower lid 20 includes a rectangular or substantially rectangular flat bottom plate 22 provided along an XY plane and a side wall 23 extending from the peripheral edge portion of the bottom plate 22 in a Z-axis direction, that is, in a direction in which the lower lid 20 and the element 10 are laminated. A recessed portion 21 defined by the surface of the bottom plate 22 and the inner surface of the side wall 23 is provided on a surface of the lower lid 20 that faces the element 10. The recessed portion 21 defines at least a portion of a vibration space of the element 10. The lower lid 20 may be a flat plate that does not include the recessed portion 21. In addition, a getter layer may be provided on a surface of the recessed portion 21 of the lower lid 20 close to the element 10.

The displaceable space of the element 10 is provided between the upper lid 30 and the lower lid 20. The upper lid 30 includes a rectangular or substantially rectangular flat bottom plate 32 provided along the XY plane and a side wall 33 extending in the Z-axis direction from the peripheral edge portion of the bottom plate 32. A recessed portion 31 defined by the surface of the bottom plate 32 and the inner surface of the side wall 33 is provided on a surface of the upper lid 30 that faces the element 10. The recessed portion 31 defines at least a portion of the displaceable space of the element 10. The upper lid 30 may be a flat plate that does not include the recessed portion 31. In addition, a getter layer may be provided on a surface of the recessed portion 31 of the upper lid 30 close to the element 10.

The displaceable space of the element 10 is hermetically sealed by the upper lid 30, the element 10, and the lower lid 20 being joined together and is maintained in a vacuum. The displaceable space may be filled with a gas, such as an inert gas, for example.

Figure 3:
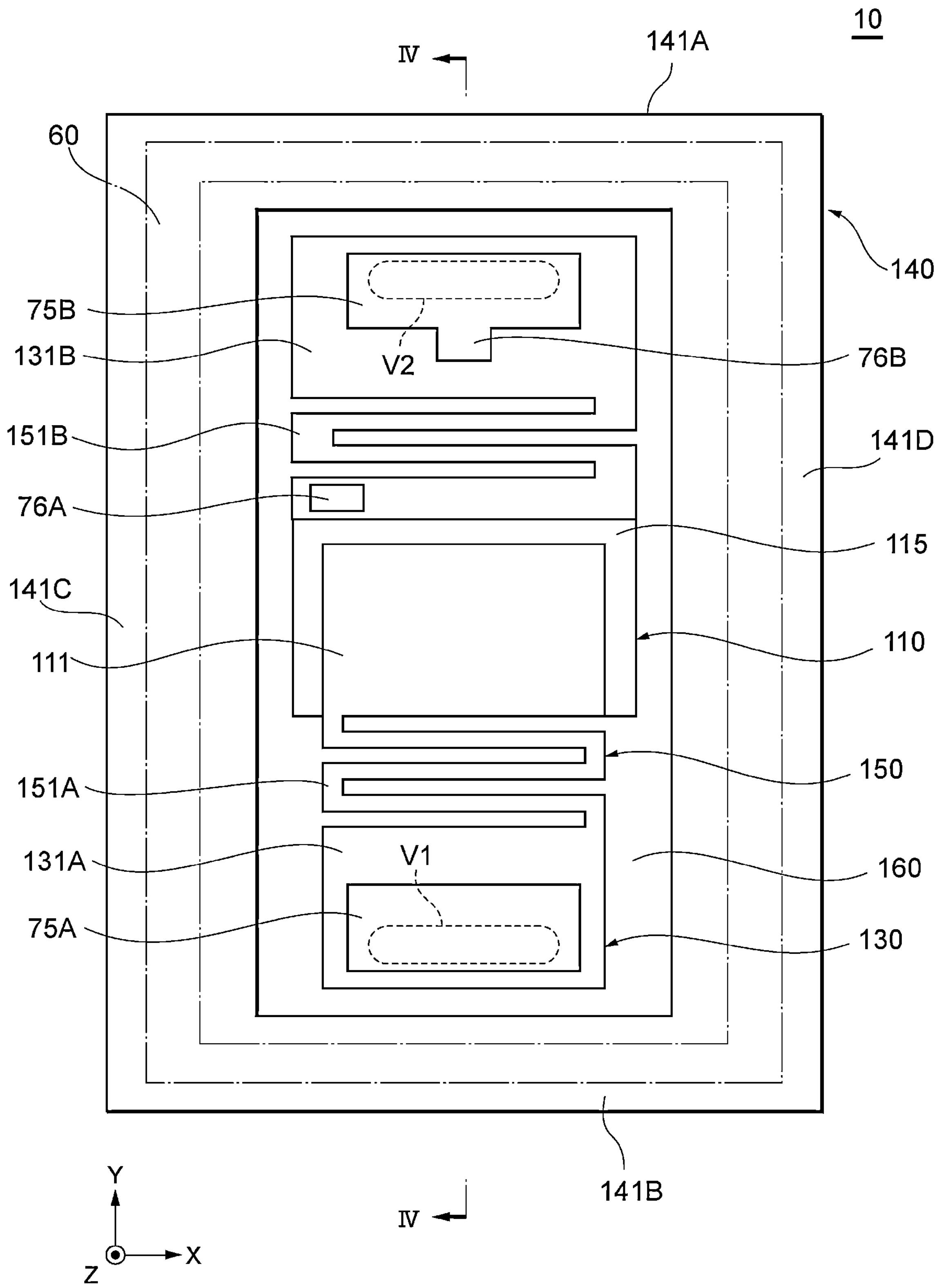
FIG. 3 is a plan view schematically illustrating the structure of the resonator illustrated in FIG. 2.

Next, the schematic structure of the element according to the present example embodiment will be described with reference to FIG. 3. FIG. 3 is a plan view schematically illustrating the structure of the element 10 illustrated in FIG. 2.

As illustrated in FIG. 3, the element 10 is a MEMS element manufactured using MEMS technology. This MEMS element is applied to, for example, timing devices, RF filters, duplexers, ultrasonic transducers, angular velocity sensors (gyro sensors), acceleration sensors, and the like. In addition, the MEMS element may also be applied to, for example, piezoelectric mirrors that have an actuator function, piezoelectric gyroscopes, piezoelectric microphones that have a pressure sensor function, ultrasonic vibration sensors, and the like. Furthermore, the MEMS element may also be applied to, for example, electrostatic MEMS elements, electromagnetically driven MEMS elements, and piezoresistive MEMS elements.

The element 10 includes the capacitance portion 110, a holding portion 130, a frame portion 140, a spring portion 150, and a groove portion 160.

The capacitance portion 110 includes a first movable electrode 111 and a second movable electrode 115. The first movable electrode 111 and the second movable electrode 115 are disposed so as to face each other with a predetermined distance therebetween in the Z-axis direction. In a plan view from above (referred to below simply as a plan view) of the main surface of the element 10, the first movable electrode 111 and the second movable electrode 115 are rectangular or substantially rectangular.

The capacitance of the capacitance portion 110 changes depending on the distance in the Z-axis direction between the first movable electrode 111 and the second movable electrode 115. More specifically, the first movable electrode 111 and the second movable electrode 115 define a parallel plate capacitor, and when acceleration acts on the capacitance portion 110 in the Z-axis direction, at least one of the first movable electrode 111 and the second movable electrode 115 is displaced depending on the acceleration, and the capacitance of the capacitor in the capacitance portion 110 changes. As described above, it is possible to detect the acceleration in the Z-axis direction by measuring the capacitance of the capacitance portion 110 that changes as the distance between the first movable electrode 111 and the second movable electrode 115 changes.

When the element 10 is an element to detect angular velocity, if the angular velocity of the Y-axis rotation about the rotation axis in the Y-axis direction acts on the capacitance portion 110 while the first movable electrode 111 and the second movable electrode 115 vibrate in the X-axis direction, at least one of the first movable electrode 111 and the second movable electrode 115 is displaced in the Z-axis direction due to the Coriolis force, and the capacitance of the capacitor in the capacitance portion 110 changes. As described above, it is possible to detect the angular velocity of the Y-axis rotation by measuring the capacitance of the capacitance portion 110 that changes as the distance between the first movable electrode 111 and the second movable electrode 115 changes.

The holding portion 130 holds the capacitance portion 110. More specifically, the holding portion 130 holds the capacitance portion 110 such that the capacitance portion 110 is displaceable at least in the Z-axis direction. Specifically, in plan view of the element 10, the holding portion 130 includes a holding body 131A disposed on the negative side of the Y-axis and a holding body 131B disposed on the positive side of the Y-axis with the capacitance portion 110 provided therebetween.

The frame portion 140 has a rectangular or substantially rectangular frame shape in a plan view of the element 10 and surrounds the outside of the capacitance portion 110 and the holding portion 130 along the XY plane. As indicated by the dot-dash lines in FIG. 3, the joining portion 60, which will be described later, is provided on the frame portion 140.

The frame portion 140 is preferably disposed in at least a portion around the capacitance portion 110 and the holding portion 130 and need not have a frame shape. For example, the frame portion 140 preferably extends sufficiently around the capacitance portion 110 and the holding portion 130 so as to be joinable to the upper lid 30 and the lower lid 20.

In the present example embodiment, the frame portion 140 includes frame elements 141A to 141D provided integrally with each other. As illustrated in FIG. 3, the frame element 141A faces the upper side of the holding body 131A with the longitudinal direction thereof parallel or substantially parallel to the X-axis. The frame element 141B faces the lower side of the holding body 131B with the longitudinal direction thereof parallel or substantially parallel to the X-axis. The frame element 141C faces the left sides of the holding body 131A and the holding body 131B and the left side portion of the capacitance portion 110 with the longitudinal direction thereof parallel or substantially parallel to the Y-axis, and both ends of the frame element 141C are connected to one end of the frame element 141A and one end of the frame element 141D. The frame element 141D faces the right sides of the holding body 131A and the holding body 131B and the right end portion of the capacitance portion 110 with the longitudinal direction thereof parallel or substantially parallel to the Y-axis, and both ends of the frame element 141D are connected to the other end of the frame element 141A and the other end of the frame element 141B. The frame element 141A and the frame element 141B face each other in the Y-axis direction with the capacitance portion 110 and the holding portion 130 sandwiched therebetween. The frame element 141C and the frame element 141D face each other in the X-axis direction with the capacitance portion 110 and the holding portion 130 sandwiched therebetween.

The spring portion 150 is disposed inside the frame portion 140 and connects the capacitance portion 110 and the holding portion 130 to each other. In addition, the spring portion 150 supports the capacitance portion 110 in a displaceable manner. More specifically, the spring portion 150 supports the first movable electrode 111 and the second movable electrode 115 in a displaceable manner with respect to the holding portion 130. Specifically, the spring portion 150 includes a spring 151A that includes one end connected to the holding body 131A and the other end connected to the first movable electrode 111 and a spring 151B that includes one end connected to the holding body 131B and the other end connected to the second movable electrode 115.

The spring 151A and the spring 151B are elastic and deform when a force is applied and return to their original shape when the force is released. In a plan view of the element 10, the spring 151A and the spring 151B have winding (meandering) shapes and fold back at the end in the X-axis direction. The number of turns of the spring 151A differs from the number of turns of the spring 151B. Accordingly, the spring constant of the spring 151A differs from the spring constant of the spring 151B.

In a plan view of the element 10, the groove portion 160 is provided in at least a portion around the holding portion 130. More specifically, the groove portion 160 is disposed inside the frame portion 140 so as to surround the holding portion 130 and the spring portion 150. Although details will be described later, the groove portion 160 is a through-hole that passes through the element 10 from the front surface to the back surface. As a result, the holding portion 130 and the spring portion 150 disposed in the groove portion 160 are isolated from the frame portion 140 disposed outside the groove portion 160.

Connection wirings 75A and 75B electrically connect the upper lid 30 and the element 10 to each other. More specifically, the connection wirings 75A and 75B electrically connect through-vias V1 and V2, described later, that are provided in the upper lid 30 and a Si substrate F2 and a Si film F3, described later, that define the element 10 to each other. Specifically, the connection wiring 75A is provided on the holding body 131A, and the connection wiring 75B is provided on the holding body 131B.

In addition, the through-via V1, described later, that passes through the upper lid 30 when the upper lid 30 and the MEMS substrate 50 (the lower lid 20 and the element 10) are joined to each other is disposed at a position illustrated by a dashed line in FIG. 3. Accordingly, the through-via V1 is electrically connected to the connection wiring 75A provided on the holding body 131A by the joining.

Similarly, a through-via V2, described later, that passes through the upper lid 30 when the upper lid 30 and the MEMS substrate 50 (the lower lid 20 and the element 10) are joined to each other is disposed at a position indicated by a dashed line in FIG. 3. Accordingly, the through-via V2 is electrically connected to the connection wiring 75B provided on the holding body 131B by the joining.

Via-electrodes 76A and 76B electrically connect the Si substrate F2 and the Si film F3 of the element 10, which will be described later. The via-electrode 76A and the via-electrode 76B extend in the Z-axis direction, the via-electrode 76A is provided in the capacitance portion 110, and the via-electrode 76B is provided in the holding body 131B of the holding portion 130.

Figure 4:
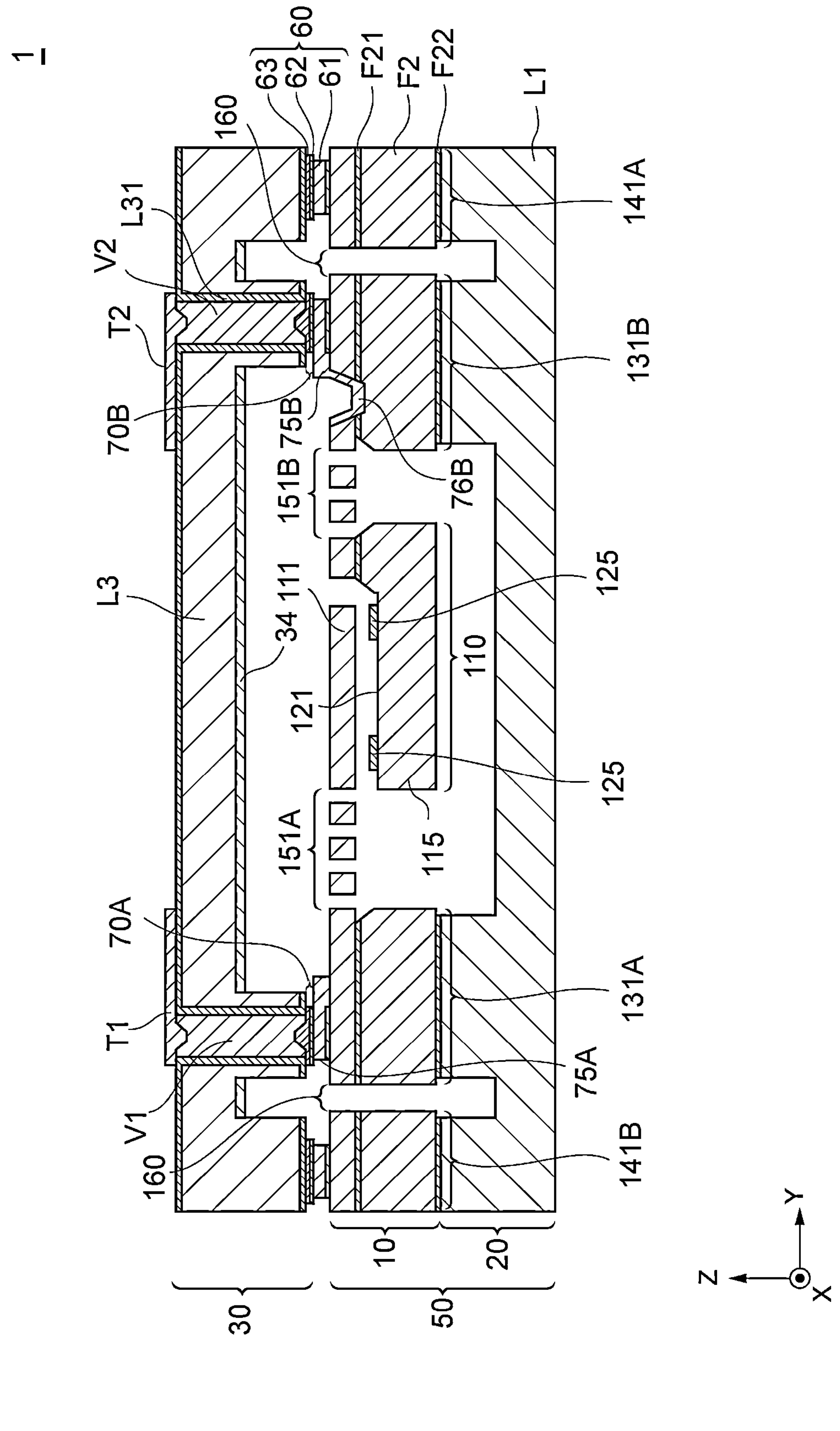
FIG. 4 is a sectional view schematically illustrating an example of the sectional structure of the inertial sensor illustrated in FIGS. 1 to 3, taken along line IV-IV.
Figure 5:
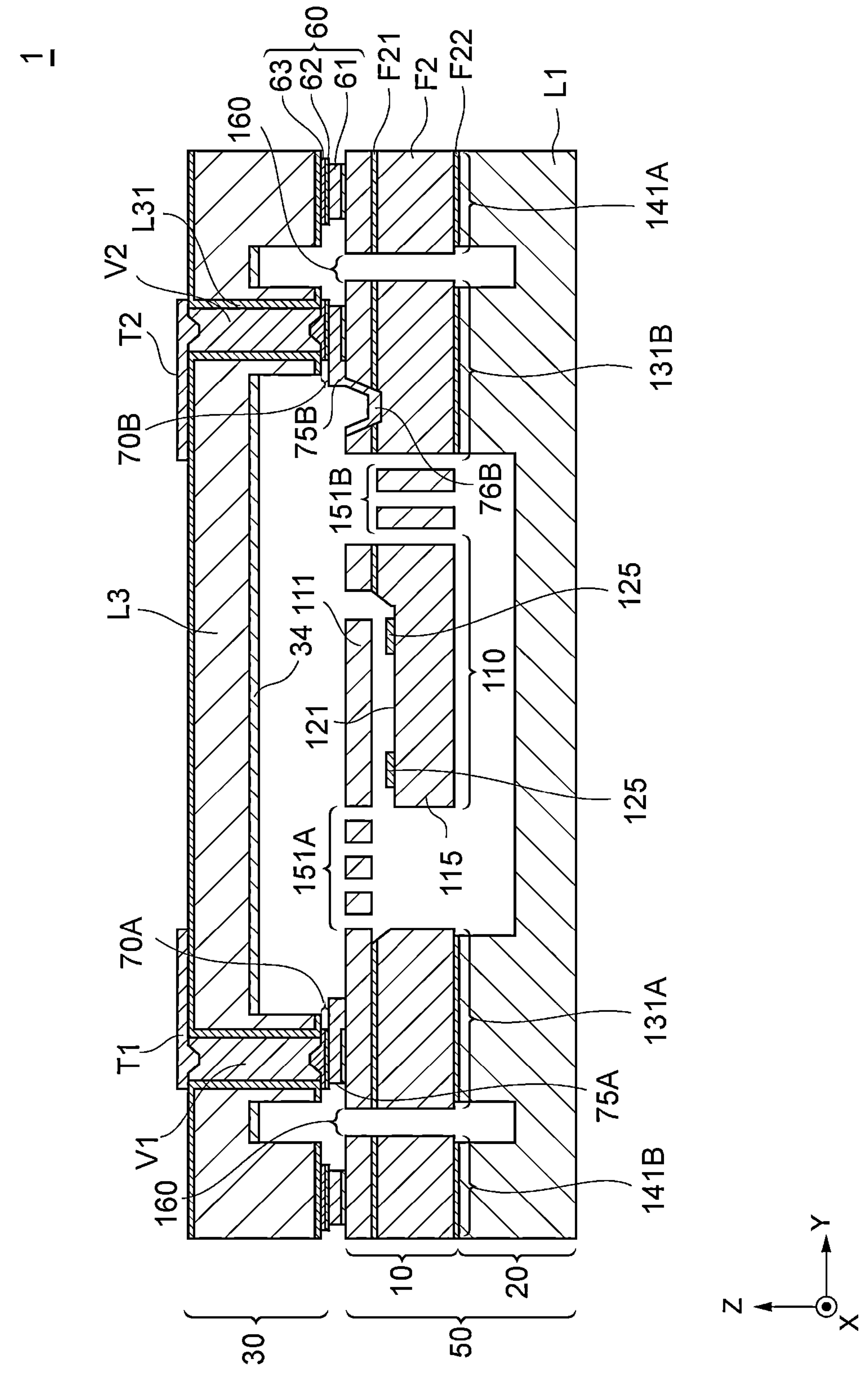
FIG. 5 is a sectional view schematically illustrating another example of the sectional structure of the inertial sensor illustrated in FIGS. 1 to 3, taken along line IV-IV.

Next, the laminated structure of the inertial sensor 1 according to the present example embodiment will be described with reference to FIGS. 4 and 5. FIG. 4 is a sectional view schematically illustrating an example of the sectional structure of the inertial sensor 1 illustrated in FIGS. 1 to 3, taken along line IV-IV. FIG. 5 is a sectional view schematically illustrating another example of the sectional structure of the inertial sensor 1 illustrated in FIGS. 1 to 3, taken along line IV-IV.

As illustrated in FIG. 4, in the inertial sensor 1, the frame portion 140 of the element 10 is joined to the side wall 23 of the lower lid 20, and the frame portion 140 of the element 10 is joined to the side wall 33 of the upper lid 30. As described above, the element 10 is held between the lower lid 20 and the upper lid 30, and the displaceable space is defined by the lower lid 20, the upper lid 30, and the frame portion 140 of the element 10. In addition, terminals T1 and T2 are provided on the upper surface of the upper lid 30 (the surface facing away from the surface facing the element 10). The terminals T1 and T2 and the element 10 are electrically connected to each other by the through-vias V1 and V2, the connection portions 70A and 70B, and the connection wirings 75A and 75B.

The upper lid 30 is made of, for example, a silicon (Si) wafer (referred to below as a Si wafer) L3 having a predetermined thickness. The upper lid 30 is connected to the frame portion 140 of the element 10 via the joining portion 60, which will be described later, in a peripheral portion (the side wall 33) thereof. The front surface of the upper lid 30 facing the element 10, the back surface of the upper lid 30, and the side surfaces of the through-vias V1 and V2 are preferably covered with, for example, a silicon oxide film L31. The silicon oxide film L31 is provided on the surface of the Si wafer L3 by, for example, surface oxidization of the Si wafer L3 or chemical vapor deposition (CVD).

In addition, a getter layer 34 is provided on a surface of the recessed portion 31 of the upper lid 30 that faces the element 10. The getter layer 34 is made of, for example, titanium (Ti) and absorbs outgas generated in a vibration space. Since the getter layer 34 is provided on the entire or substantially the entire surface of the recessed portion 31 that faces the element 10 in the upper lid 30 according to the present example embodiment, a reduction in the vacuum degree of the displaceable space can be decreased or prevented.

The through holes provided in the upper lid 30 are filled with a conductive material to define the through-vias V1 and V2. The conductive material with which the through holes are filled is, for example, polycrystalline silicon (Poly-Si), copper (Cu), or gold (Au) doped with an impurity, single-crystal silicon doped with an impurity, or the like. The through-via V1 is wiring that electrically connects the terminal T1 and the connection portion 70A to each other, and the through-via V2 is wiring that electrically connects the terminal T2 and the connection portion 70B to each other.

The bottom plate 22 and the side wall 23 of the lower lid 20 are integrally made of, for example, a Si wafer L1. In addition, the lower lid 20 is joined to the frame portion 140 of the element 10 by the upper surface of the side wall 23. The thickness of the lower lid 20 in the Z-axis direction is, for example, about 150 μm, and the depth of the recessed portion 21 in the Z-axis direction is, for example, about 50 μm. The Si wafer L1 is made of, for example, non-degenerate silicon and has a resistivity of, for example, about 16 mΩ·cm or more.

In the element 10, the capacitance portion 110, the holding portion 130, the frame portion 140, the spring portion 150, and the groove portion 160 are integrally formed by the same process. In the element 10, a silicon oxide (for example, $SiO_2$) layer F21 is formed on the silicon (Si) substrate (referred to below as a Si substrate) F2, which is an example of the substrate, and the silicon (Si) film (referred to below as the Si film) F3 is formed on the silicon oxide layer F21. The external shapes of the capacitance portion 110, the holding portion 130, the spring portion 150, and the groove portion 160 are formed by a laminated body including the Si substrate F2, the silicon oxide layer F21, the Si film F3, and the like being removed and machined by dry etching that irradiates the laminated body with, for example, an argon (Ar) ion beam and then being patterned.

The Si substrate F2 is formed of, example, a degenerate n-type silicon (Si) semiconductor with a thickness of about 6 μm and may include, for example, phosphorus (P), arsenic (As), antimony (Sb), and the like as n-type dopants. In addition, the resistance of the degenerate silicon (Si) used for the Si substrate F2 is, for example, less than about 1.6 mΩ·cm and preferably about 1.2 mΩ·cm or less. Use of the degenerate silicon (Si) as the Si substrate F2 can reduce the resistance of the Si substrate F2. In addition, a silicon oxide layer F22 made of, for example, $SiO_2$, which is an example of a temperature characteristic correction layer, is formed as a lower surface of the Si substrate F2. This can improve temperature characteristics.

An example in which a degenerate silicon substrate is used for the Si substrate F2 is illustrated in the present example embodiment, but the present invention is not limited to this example. For example, the Si substrate F2 may be a single-crystal Si substrate. Use of a single-crystal Si substrate as the Si substrate F2 of the element 10 can reduce or prevent hillocks, which may be generated in aluminum (Al), from forming due to heat treatment or the like.

The material of the Si film F3 is preferably the same as that of the Si substrate F2. The material of the Si film F3 is, for example, single-crystal silicon (Si) as in the Si substrate F2. As a result, in the capacitance portion 110, the material of the first movable electrode 111 defined by the Si substrate F2 is the same or substantially the same as that of the second movable electrode 115 defined by the Si film F3.

Since the material of the first movable electrode 111 is the same or substantially the same as that of the second movable electrode 115, a potential difference due to a difference in work function resulting from the use of different materials is less likely to occur between the first movable electrode 111 and the second movable electrode 115.

The joining portion 60 has a rectangular or substantially rectangular ring shape along the XY plane between the MEMS substrate 50 (the element 10 and the lower lid 20) and the upper lid 30. The joining portion 60 joins the MEMS substrate 50 and the upper lid 30 to each other to seal the displaceable space of the element 10. As a result, the displaceable space is hermetically sealed and maintained in a vacuum.

In the present example embodiment, in the joining portion 60, for example, an aluminum (Al) layer 61, a germanium (Ge) layer 62, and an aluminum (Al) layer 63 are laminated in this order. When the material used for the joining portion 60 is the same type of metal as used for the connection portions 70A and 70B and the connection wirings 75A and 75B, which will be described later, the manufacturing process can be simplified.

The aluminum (Al) layer 61, the germanium (Ge) layer 62, and the aluminum (Al) layer 63 are described as independent layers in the example illustrated in FIG. 4, but these layers are eutectic-joined to each other at the interfaces thereof. The joining portion 60 may be made of, for example, a gold (Au) film, a tin (Sn) film, or the like or may be formed of a combination of gold (Au) and silicon (Si), gold (Au) and gold (Au), copper (Cu) and tin (Sn), or the like. In addition, to improve adhesiveness, the joining portion 60 may include, for example, a thin layer of titanium (Ti), titanium nitride (TiN), tantalum nitride (TaN), or the like between laminated layers.

The connection portion 70A is electrically connected to the terminal T1 via the through-via V1 and electrically connected to the connection wiring 75A. Similarly, the connection portion 70B is electrically connected to the terminal T2 via the through-via V2 and electrically connected to the connection wiring 75B.

The connection portion 70A and the connection wiring 75B include a first metal layer and a second metal layer, respectively. The first metal layer and the second metal layer are illustrated as independent layers in the example illustrated in FIG. 4, but these layers are eutectic-joined to each other at the interface thereof. That is, the connection portions 70A and 70B include a eutectic alloy of the first metal layer and the second metal layer.

When the connection portions 70A and 70B are formed, the first metal layer is first provided on an upper lid 30 side, and the second metal layer is provided on a MEMS substrate 50 side. Next, the positions of the MEMS substrate 50 and the upper lid 30 are adjusted such that the first metal layer coincides with the second metal layer. After the positions are adjusted, the MEMS substrate 50 and the upper lid 30 are sandwiched by a heater or the like, and heat treatment for a eutectic junction is performed. The temperature of the heat treatment for the eutectic junction is equal to or higher than the eutectic point, for example, about 424° C. or higher, and the heating time is about 10 minutes or more and about 20 minutes or less. During heating, the inertial sensor 1 is pressed from the upper lid 30 onto the MEMS substrate 50 with a pressure of, for example, about 5 MPa or more and about 25 MPa or less.

In the present example embodiment, for example, the material of the first metal 1 layer is germanium (Ge) and the material of the second metal layer is aluminum (Al). Since the eutectic alloy of germanium (Ge) and aluminum (Al) has a larger tolerance for foreign particles than eutectic alloys of other materials, a eutectic reaction easily occurs and the connection portions 70A and 70B that achieve a favorable eutectic junction can be obtained.

The connection wirings 75A and 75B are electrically connected to the element 10. Specifically, the connection wirings 75A and 75B are electrically connected to the capacitance portion 110 of the element 10 via the via-electrodes 76A and 76B, which will be described later. The connection wirings 75A and 75B are made of metals, such as, for example, aluminum (Al), gold (Au), and tin (Sn).

In the present example embodiment, the material of the connection wirings 75A and 75B is, for example, aluminum (Al), which is the same as the material of the second metal layer of the connection portions 70A and 70B. As a result, the connection wirings 75A and 75B can be formed at the same time as the second metal layers of the connection portions 70A and 70B, and accordingly, the manufacturing process can be simplified.

The via-electrode 76A electrically connects the Si substrate F2 and the Si film F3 to each other in the capacitance portion 110. The via-electrode 76B is in contact with the connection wiring 75B and electrically connects the Si substrate F2 and the Si film F3 to each other in the capacitance portion 110. Specifically, portions of the Si silicon oxide layer F21 and the Si film F3 laminated on the Si substrate F2 are removed to expose the Si substrate F2, and the formed through-hole is filled with a conductive material, and accordingly, the via-electrodes 76A and 76B that connect the Si substrate F2 and the Si film F3 to each other are formed. The via-electrodes 76A and 76B are made of a metal, such as, for example, aluminum (Al), gold (Au), or tin (Sn).

The capacitance portion 110 is defined by portions of the Si film F3, the silicon oxide layer F21, and the Si substrate F2 being removed and machined. Specifically, a portion of the Si film F3 is removed to form an opening in the capacitance portion 110, and the first movable electrode 111 is formed of the portion of the Si film F3 that has not been removed. In addition, after the silicon oxide layer F21 and a portion of the Si substrate F2 are removed in the capacitance portion 110, the second movable electrode 115 is defined by the portion of the Si substrate F2 that has not been removed.

The spring portion 150 is defined by a portion of the Si film F3 being removed and machined. One end of the spring 151A is connected to the Si film F3 in the holding body 131A, and the other end is connected to the first movable electrode 111 of the capacitance portion 110. As a result, the first movable electrode 111 is supported in a displaceable manner, for example, in the Z-axis direction with respect to the holding body 131A of the holding portion 130. In addition, one end of the spring 151B is connected to the Si film F3 in the holding body 131B, and the other end is connected to the second movable electrode 115 via the Si film F3 and the silicon oxide layer F21 in the capacitance portion 110. As a result, the second movable electrode 115 is supported in a displaceable manner, for example, in the Z-axis direction with respect to the holding body 131B of the holding portion 130.

As described above, since the spring portion 150 isolates the first movable electrode 111 and the second movable electrode 115 from the holding portion 130 by the spring portion 150 supporting the first movable electrode 111 and the second movable electrode 115 in a displaceable manner, even when the upper lid 30 deforms in response to external pressure or a force caused by a difference in thermal expansion, the force associated with the deformation is less likely to be applied by the spring portion 150 to the first movable electrode 111 and the second movable electrode 115, and changes in the inter-electrode distance between the first movable electrode 111 and the second movable electrode 115 due to the deformation of the upper lid 30 can be reduced. Accordingly, a reduction in the detection accuracy of the capacitance of the capacitance portion 110 is decreased or prevented.

The capacitance portion 110 includes a cavity 121 with a predetermined depth. The cavity 121 defines a space with a gap corresponding to a predetermined depth between the first movable electrode 111 and the second movable electrode 115 in the Z-axis direction. The cavity 121 is formed by, for example, removing a portion of the Si substrate F2 in the capacitance portion 110 by dry etching or the like through an opening in the Si film F3. It should be noted that the cavity 121 may also be formed by, for example, thinning a portion of the Si film F3 instead of removing a portion of the Si substrate F2 or by thinning a portion of the Si film F3 in addition to removing a portion of the Si substrate F2. As illustrated in FIG. 4, the cavity 121 may communicate with the displaceable space defined by the upper lid 30 and the element 10. In addition, the cavity 121 may communicate with the displaceable space defined by the lower lid 20 and the element 10.

As described above, since the capacitance portion 110 includes the cavity 121 that defines a space between the first movable electrode 111 and the second movable electrode 115, the original capacitance of the capacitance portion 110 to which no force is applied can be easily adjusted by changing the depth of the cavity 121.

In addition, one or more bumps 125 are provided on the bottom surface of the cavity 121, that is, the upper surface of the second movable electrode 115. Each of the bumps 125 has a shape projecting into the space defined by the cavity 121. As a result, when the first movable electrode 111 and the second movable electrode 115 come into contact with each other due to displacement of at least one of these electrodes, sticking between the electrodes can be reduced or prevented from occurring.

The material of the bumps 125 is, for example, amorphous silicon not having a crystalline structure (also referred to simply as amorphous silicon). The amorphous silicon is, for example, polycrystalline silicon (Poly-Si), vapor deposition silicon, sputtering silicon, or the like. In addition, the amorphous silicon of the bumps 125 is preferably doped with an impurity (dopant). The impurity added to or injected into the amorphous silicon by doping may include, for example, phosphorus (P), boron (B), or arsenic (As).

Since the material of the bumps 125 is the amorphous silicon doped with an impurity, by the conductivity of the bumps 125 being adjusted by the impurity, the capacitance portion 110 can be prevented from being damaged due to a short-circuit when the first movable electrode 111 is in contact with the second movable electrode 115, and the bumps 125 can be prevented from being charged with electricity because electric charge is stored.

An example in which the bumps 125 are provided on the upper surface of the second movable electrode 115 is illustrated in the present example embodiment, but the present invention is not limited to this example. For example, the bumps 125 may also be provided on the upper surface of the cavity 121, that is, on the lower surface of the first movable electrode 111, in addition to on the upper surface of the second movable electrode 115 or may also be provided on the upper surface of the cavity 121 instead of on the upper surface of the second movable electrode 115.

The groove portion 160 is disposed in at least a portion around the holding portion 130 between the holding portion 130 and the frame portion 140. The groove portion 160 passes from the Si film F3 to the Si silicon oxide layer F22 of the element 10. As in the example illustrated in FIG. 4, the recessed portion may be provided at a position in the lower lid 20 that corresponds to the groove portion 160 of the element 10. Similarly, a recessed portion may also be provided at a position on the upper lid 30 that corresponds to the groove portion 160 of the element 10.

Since the groove portion 160 is provided in at least a portion around the holding portion 130 and the groove portion 160 isolates the holding portion 130 from the outer edge of the inertial sensor 1, even when the upper lid 30 deforms in response to external pressure, a force caused by a difference in thermal expansion, or the like, the force associated with the deformation is less likely to be applied to the first movable electrode 111 and the second movable electrode 115 due to the groove portion 160.

An example in which the spring 151A and the spring 151B of the spring portion 150 are provided in a portion of the Si film F3 of the element 10 is illustrated in the present example embodiment, but the present invention is not limited to this example.

As illustrated in FIG. 5, the spring portion 150 may be defined by a portion of the Si film F3 and a portion of the Si substrate F2 being removed and machined. That is, as in the example illustrated in FIG. 4, one end of the spring 151A is connected to the Si film F3 of the holding body 131A and the other end is connected to the first movable electrode 111 of the capacitance portion 110. On the other hand, unlike the example illustrated in FIG. 4, one end of the spring 151B may be connected to the Si substrate F2 of the holding body 131B, and the other end may be directly connected to the second movable electrode 115 of the capacitance portion 110.

The spring portion 150 need not include the two springs 151A and 151B and may include one spring or three or more springs. In addition, the shapes, the disposition, the number of turns, and the like of the springs 151A and 151B of the element 10 in plan view are not limited to the example illustrated in FIG. 4. Furthermore, as long as the spring portion 150 supports the first movable electrode 111 and the second movable electrode 115 in a displaceable manner with respect to the holding portion 130, the aspects of the holding portion 130 and the spring portion 150 may differ from the example illustrated in FIG. 4.

An illustrative example embodiment of the present invention has been described above. In the inertial sensor according to the present example embodiment, the spring portion supports the first movable electrode and the second movable electrode in a displaceable manner. As a result, since the spring portion isolates the first movable electrode and the second movable electrode from the holding portion, even when external pressure or a force caused by a difference in thermal expansion deforms the upper lid, the force associated with the deformation is less likely to be applied to the first movable electrode and the second movable electrode due to the spring portion, and changes in the distance between the first movable electrode and the second movable electrode due to the deformation of the upper lid can be reduced. Accordingly, a reduction in the detection accuracy of the capacitance of the capacitance portion can be decreased or prevented.

In addition, in the inertial sensor described above, the capacitance portion further includes the cavity that defines a space between the first movable electrode and the second movable electrode. As a result, the original capacitance of the capacitance portion to which no force is applied can be easily adjusted by changing the depth of the cavity.

In addition, in the inertial sensor described above, the capacitance portion further includes the bumps that project into the space defined by the cavity 121 in at least one of the first movable electrode and the second movable electrode. As a result, when the first movable electrode and the second movable electrode come into contact with each other due to displacement of at least one of these electrodes, sticking between the electrodes can be reduced or prevented.

In addition, in the inertial sensor described above, the material of the bumps is, for example, amorphous silicon doped with an impurity. Accordingly, by the conductivity of the bumps being adjusted by the impurity, the capacitance portion can be prevented from being damaged due to a short-circuit when the first movable electrode is in contact with the second movable electrode, and the bumps can be prevented from being charged with electricity because electric charge is stored.

In addition, in the inertial sensor described above, the groove portion is provided in at least a portion around the holding portion in a plan view of the element. As a result, since the groove portion isolates the holding portion from the outer edge of the inertial sensor, even when the upper lid deforms in response to external pressure, a force caused by a difference in thermal expansion, or the like, the force associated with the deformation is less likely to be applied to the first movable electrode and the second movable electrode due to the groove portion.

In addition, in the inertial sensor described above, the material of the first movable electrode is the same or substantially the same as that of the second movable electrode. As a result, a potential difference due to a difference in work function resulting from the use of different materials is less likely to occur between the first movable electrode and the second movable electrode.

The example embodiments described above are intended to facilitate understanding of the present invention and are not intended to limit the scope of the present invention. The present invention may be modified or improved without departing from the spirit thereof, and the present invention includes equivalents thereof. That is, any design changes made to the example embodiments and/or the modifications thereof are also included within the scope of the present invention. For example, the components included in the example embodiments and/or the modifications, the disposition, the materials, the conditions, the shapes, and the sizes thereof are not limited to those illustrated and can be changed as appropriate. In addition, the example embodiments and the modifications are only examples, and partial replacements or combinations of the components illustrated in different example embodiments and/or the modifications are possible, and are also included in the scope of the present invention.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A MEMS device comprising:
a first substrate including:
a capacitance portion including a first movable electrode and a second movable electrode causing a capacitance to change in accordance with a distance between the first movable electrode and the second movable electrode;
a holding portion holding the capacitance portion; and
an elastic portion connecting the capacitance portion and the holding portion to each other, the elastic portion supporting the first movable electrode and the second movable electrode in a displaceable manner with respect to the holding portion; and
a second substrate joined to the first substrate; wherein
at least a portion of the first movable electrode and at least a portion of the second movable electrode face each other in a direction in which at least one of the first and second movable electrodes is displaceable.

2. The MEMS device according to claim 1, wherein the capacitance portion includes a cavity that defines a space between the first movable electrode and the second movable electrode.

3. The MEMS device according to claim 1, wherein the first substrate includes a groove in at least a portion around the holding portion in plan view.

4. The MEMS device according to claim 3, wherein the first substrate includes a frame portion outside of the groove.

5. The MEMS device according to claim 4, wherein the frame portion is joined to a side wall of the second substrate.

6. The MEMS device according to claim 1, wherein a material of the first movable electrode is the same or substantially the same as a material of the second movable electrode.

7. The MEMS device according to claim 1, wherein the first substrate is a MEMS substrate.

8. The MEMS device according to claim 1, wherein the second substrate is an upper lid.

9. The MEMS device according to claim 1, further comprising a lower lid joined to the first substrate.

10. The MEMS device according to claim 9, wherein the lower lid is defined by a Si substrate.

11. The MEMS device according to claim 1, wherein the first substrate and the second substrate are each defined by a Si substrate.

12. The MEMS device according to claim 11, wherein the first substrate, the second substrate, and the lower lid are hermetically sealed.

13. The MEMS device according to claim 1, wherein the first substrate and the second substrate are each defined by a silicon-on-insulator substrate.

14. The MEMS device according to claim 1, wherein a getter layer is provided on the second substrate.

15. The MEMS device according to claim 1, wherein the lower lid is defined by a silicon-on-insulator substrate.

16. The MEMS device according to claim 1, wherein the first substrate and the second substrate are electrically connected by connection wirings.

17. The MEMS device according to claim 14, wherein the getter layer is made of titanium.

18. A MEMS device comprising:
a first substrate including:
a capacitance portion including a first movable electrode and a second movable electrode causing a capacitance to change in accordance with a distance between the first movable electrode and the second movable electrode;
a holding portion holding the capacitance portion; and
an elastic portion connecting the capacitance portion and the holding portion to each other, the elastic portion supporting the first movable electrode and the second movable electrode in a displaceable manner with respect to the holding portion; and
a second substrate joined to the first substrate; wherein
the capacitance portion includes a cavity that defines a space between the first movable electrode and the second movable electrode; and
the capacitance portion includes a bump projecting into the space on at least one of the first movable electrode and the second movable electrode.

19. The MEMS device according to claim 18, wherein a material of the bump is amorphous silicon doped with an impurity.

20. A MEMS device comprising:
a first substrate including:
a capacitance portion including a first movable electrode and a second movable electrode causing a capacitance to change in accordance with a distance between the first movable electrode and the second movable electrode;
a holding portion holding the capacitance portion; and
an elastic portion connecting the capacitance portion and the holding portion to each other, the elastic portion supporting the first movable electrode and the second movable electrode in a displaceable manner with respect to the holding portion;
a second substrate joined to the first substrate; and
a lower lid joined to the first substrate; wherein
the lower lid has a thickness of about 150 μm.

* * * * *